(12) United States Patent  
Blatchford

(10) Patent No.: US 8,575,020 B2  
(45) Date of Patent: *Nov. 5, 2013

(54) PATTERN-SPLIT DECOMPOSITION STRATEGY FOR DOUBLE-PATTERNED LITHOGRAPHY PROCESS

(75) Inventor: James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 16 days.

This patent is subject to a terminal disclaimer.

(21) Appl. No.: 13/410,188

(22) Filed: Mar. 1, 2012

(65) Prior Publication Data

US 2012/0225551 A1 Sep. 6, 2012

Related U.S. Application Data

(60) Provisional application No. 61/448,447, filed on Mar. 2, 2011.

(51) Int. Cl.
  *H01L 21/28* (2006.01)
  *H01L 21/4763* (2006.01)

(52) U.S. Cl.
  USPC ........... 438/622; 438/637; 438/708; 438/717; 438/720; 257/E21.576; 257/E21.577

(58) Field of Classification Search
  USPC .......... 438/622, 637, 708, 720; 257/E21.576, 257/E21.577
  See application file for complete search history.

(56) References Cited

U.S. PATENT DOCUMENTS

| | | | | |
|---|---|---|---|---|
| 6,403,413 B2* | 6/2002 | Hayano et al. | ................ | 438/238 |
| 6,541,396 B2* | 4/2003 | Kawahara et al. | ............ | 438/780 |
| 6,632,744 B2* | 10/2003 | Imai et al. | ..................... | 438/692 |
| 6,653,238 B2* | 11/2003 | Kim et al. | ..................... | 438/700 |
| 7,233,052 B2* | 6/2007 | Tamaoka et al. | .............. | 257/522 |
| 7,351,666 B2* | 4/2008 | Furukawa et al. | ............ | 438/736 |
| 7,531,456 B2* | 5/2009 | Kwon et al. | .................. | 438/671 |

(Continued)

OTHER PUBLICATIONS

James W. Blatchford, Steven L. Prins, Scott W. Jessen, Thuc Dam, KiHo Baik, Linyong Pang and Bob Gleason, "Litho/Design Co-optimization and Area Scaling for the 22-nm Logic Node", Presented at the China Semiconductor International Conference 2010, Mar. 16-18, 2010, Shanghai, China, ECS Transactions 27 (1), 449 (2010). Published by The Electrochemical Society, Pennington, NJ.

*Primary Examiner* — Mary Wilczewski
(74) *Attorney, Agent, or Firm* — Jacqueline J. Garner; Wade J. Brady, III; Frederick J. Telecky, Jr.

(57) ABSTRACT

An integrated circuit may be formed by a process of forming a first interconnect pattern in a plurality of parallel route tracks, and forming a second interconnect pattern in the plurality of parallel route tracks. The first interconnect pattern includes a first lead pattern which extends to a first point in an instance of the first plurality of parallel route tracks, and the second interconnect pattern includes a second lead pattern which extends to a second point in the same instance of the plurality of parallel route tracks, such that the second point is laterally separated from the first point by a distance one to one and one-half times a space between adjacent parallel lead patterns in the plurality of parallel route tracks. A metal interconnect formation process is performed which forms metal interconnect lines in an interconnect level defined by the first interconnect pattern and the second interconnect pattern.

10 Claims, 10 Drawing Sheets

(56) References Cited

U.S. PATENT DOCUMENTS

| | | | |
|---|---|---|---|
| 7,534,723 B2 * | 5/2009 | Park et al. | 438/669 |
| 7,615,497 B2 * | 11/2009 | Bok et al. | 438/736 |
| 7,694,269 B2 * | 4/2010 | Savithri et al. | 716/50 |
| 7,829,168 B2 * | 11/2010 | Zhang et al. | 428/64.1 |
| 7,897,058 B2 * | 3/2011 | Van Haren et al. | 216/41 |
| 7,928,007 B2 * | 4/2011 | Petti | 438/645 |
| 8,048,762 B2 * | 11/2011 | Ohuchi | 438/424 |
| 8,176,443 B2 * | 5/2012 | Rathsack et al. | 716/50 |
| 8,309,462 B1 * | 11/2012 | Yoshida et al. | 438/672 |
| 8,309,469 B2 * | 11/2012 | Kajiwara | 438/717 |
| 8,372,743 B2 * | 2/2013 | Blatchford | 438/622 |
| 2002/0014697 A1 * | 2/2002 | Tamaoka et al. | 257/758 |
| 2002/0025690 A1 * | 2/2002 | Kawahara et al. | 438/780 |
| 2003/0146495 A1 * | 8/2003 | Tamaoka et al. | 257/618 |
| 2005/0161824 A1 * | 7/2005 | Tamaoka et al. | 257/758 |
| 2006/0277521 A1 | 12/2006 | Chen et al. | |
| 2007/0077523 A1 | 4/2007 | Finders | |
| 2007/0099424 A1 * | 5/2007 | Rathsack et al. | 438/689 |
| 2007/0148968 A1 * | 6/2007 | Kwon et al. | 438/671 |
| 2007/0178389 A1 * | 8/2007 | Yoo | 430/5 |
| 2007/0249157 A1 | 10/2007 | Matsubara | |
| 2008/0020296 A1 | 1/2008 | Hsu et al. | |
| 2008/0081461 A1 * | 4/2008 | Lee et al. | 438/637 |
| 2008/0203518 A1 * | 8/2008 | Savithri et al. | 257/499 |
| 2009/0300567 A1 * | 12/2009 | Rathsack et al. | 716/8 |
| 2012/0131522 A1 * | 5/2012 | Blatchford | 716/55 |
| 2012/0148942 A1 * | 6/2012 | Blatchford | 430/5 |
| 2012/0223439 A1 * | 9/2012 | Blatchford et al. | 257/774 |
| 2012/0225550 A1 * | 9/2012 | Blatchford | 438/637 |
| 2012/0225551 A1 * | 9/2012 | Blatchford | 438/637 |
| 2012/0225552 A1 * | 9/2012 | Blatchford | 438/637 |
| 2012/0331425 A1 * | 12/2012 | Blatchford | 716/52 |

* cited by examiner

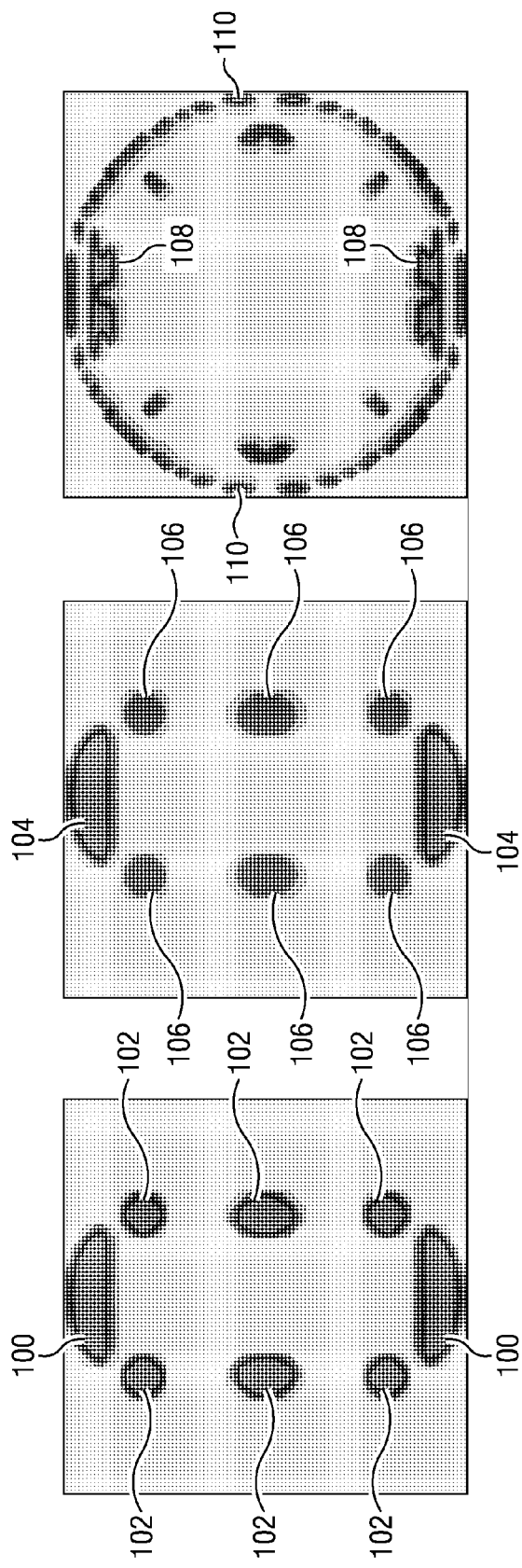

PATTERN-SPLIT DECOMPOSITION STRATEGY FOR DOUBLE-PATTERNED LITHOGRAPHY PROCESS

CROSS-REFERENCE TO RELATED APPLICATIONS

This application claims the benefit of priority under U.S.C. §119(e) of U.S. Provisional Application 61/448,447 (filed Mar. 2, 2011.

The following applications are related and hereby incorporated by reference:

patent application Ser. No. 13/410,241, (filed Mar. 1, 2012) entitled "TWO-TRACK CROSS-CONNECT IN DOUBLE-PATTERNED STRUCTURE USING RECTANGULAR VIA,"

patent application Ser. No. 13/410,236 (filed Mar. 1, 2012) entitled "TWO-TRACK CROSS-CONNECTS IN DOUBLE-PATTERNED METAL LAYERS USING A FORBIDDEN ZONE," and patent application Ser. No. 13/410,145 (filed Mar. 1, 2012) entitled "HYBRID PITCH-SPLIT PATTERN-SPLIT LITHOGRAPHY PROCESS."

FIELD OF THE INVENTION

This invention relates to the field of integrated circuits. More particularly, this invention relates to photolithography processes for forming integrated circuits.

BACKGROUND OF THE INVENTION

Integrated circuits may be formed using photolithography processes with illuminations sources having wavelengths more than twice a desired pitch distance of metal interconnect lines in the integrated circuits. Attaining desired tradeoffs between fabrication costs and fabrication yield may be difficult. For example, technology nodes at and beyond the 28 nanometer node using 193 nanometer illumination sources may require more than one pattern step to obtain desired first metal interconnect layouts. Forming crossovers between adjacent parallel route tracks, u-turns and separated lines in the first metal level with desired lateral dimensions may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by a process of forming a first interconnect pattern in a plurality of parallel route tracks, and forming a second interconnect pattern in the plurality of parallel route tracks. The first interconnect pattern includes a first lead pattern which extends to a first point in an instance of the first plurality of parallel route tracks, and the second interconnect pattern includes a second lead pattern which extends to a second point in the same instance of the plurality of parallel route tracks, such that the second point is laterally separated from the first point by a distance of one to one and one-half times a space between adjacent parallel lead patterns in the plurality of parallel route tracks. A metal interconnect formation process is performed which forms metal interconnect lines in an interconnect level defined by the first interconnect pattern and the second interconnect pattern. A first lead and a second lead are formed by the metal interconnect formation process in an area defined by the first lead pattern and an area defined by the second lead pattern, respectively. The first lead and the second lead are laterally separated at the first point and second point by a distance of one to one and one-half of a space between adjacent parallel metal interconnect lines in the plurality of parallel route tracks. The first lead and/or the second lead may extend out of the route track at the first point and/or the second point, respectively, for example to form a crossover to another route track.

DESCRIPTION OF THE VIEWS OF THE DRAWING

FIG. 1A through FIG. 1C depict exemplary illumination sources for photolithographic processes which may be used to form integrated circuits according to embodiments described herein.

DETAILED DESCRIPTION OF EXAMPLE EMBODIMENTS

Figure 2A:
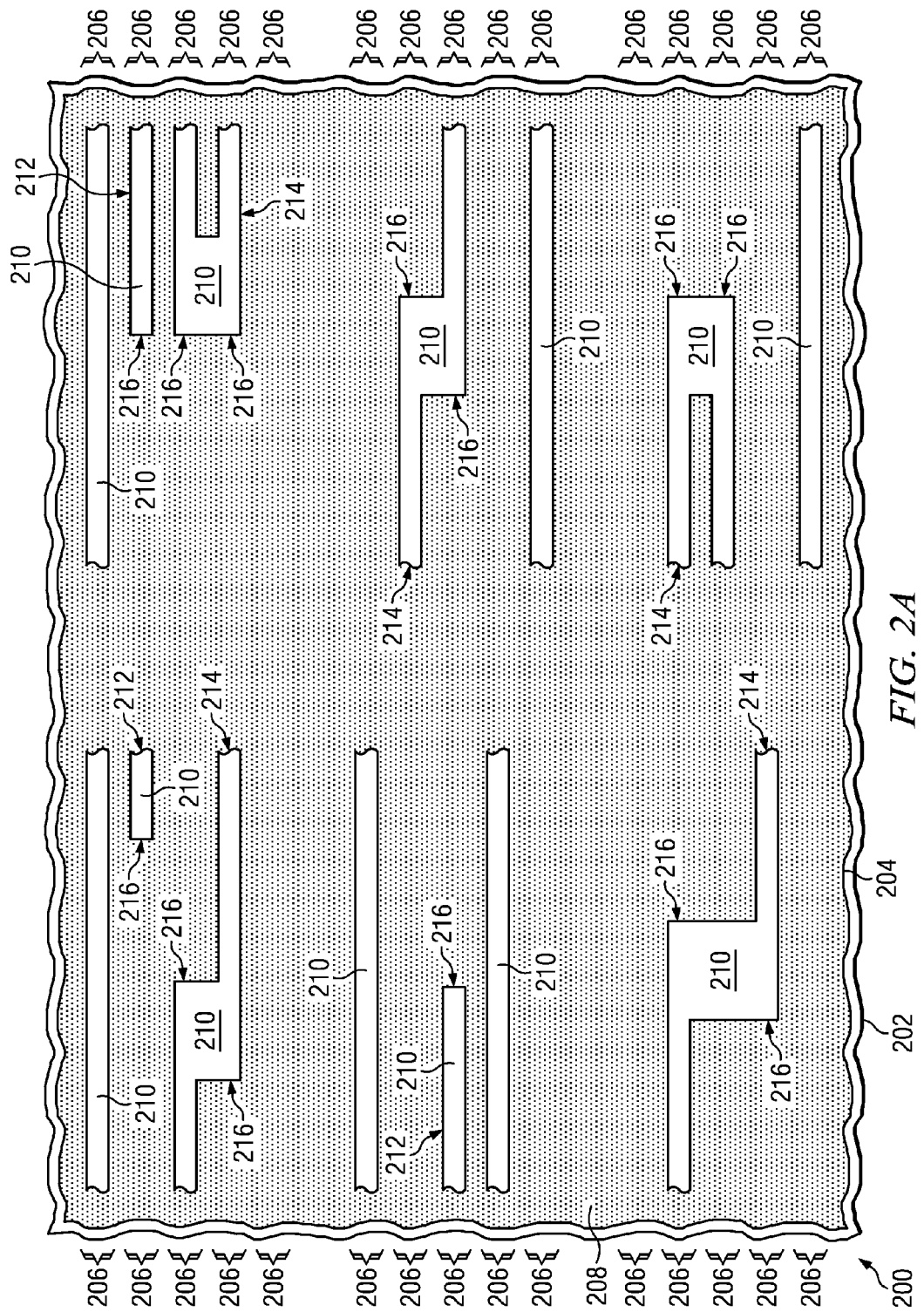
FIG. 2A through FIG. 2E are top views of an integrated circuit formed according a first embodiment using a damascene metal process and an illumination source with a dipole component, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed by a process of forming a first interconnect pattern in a plurality of parallel route tracks, and forming a second interconnect pattern in the plurality of parallel route tracks. The first interconnect pattern includes a first lead pattern which extends to a first point in an instance of the first plurality of parallel route tracks, and the second interconnect pattern includes a second lead pattern which extends to a second point in the same instance of the plurality of parallel route tracks, such that the second point is laterally separated from the first point by a distance of one to one and one-half times a space between adjacent parallel lead patterns in the plurality of parallel route tracks. A metal interconnect formation process is performed which forms metal interconnect lines in an interconnect level defined by the first interconnect pattern and the second interconnect pattern. A first lead and a second lead are formed by the metal interconnect formation process in an area defined by the first lead pattern and an area defined by the second lead pattern, respectively. The first lead and the second lead are laterally separated at the first point and second point by a distance of one to one and one-half of a space between adjacent parallel metal interconnect lines in the plurality of parallel route tracks. The first lead and/or the second lead may extend out of the route track at the first point and/or the second point, respectively, for example to form a crossover to another route track.

FIG. 1A through FIG. 1C depict exemplary illumination sources for photolithographic processes which may be used to form integrated circuits according to embodiments described herein. FIG. 1A depicts an off-axis illumination source with a moderate dipole component; the emitting area is configured in two large dipole regions 100 along the vertical direction and smaller source regions 102 along the horizontal and diagonal directions. FIG. 1B depicts an off-axis illumination source with a strong dipole component; the emitting area is configured in two large dipole regions 104 along the vertical direction and smaller, weaker source regions 106 along the horizontal and diagonal directions. FIG. 1C depicts an off-axis illumination source with a dipole component; the emitting area is configured in two dipole regions 108 along the vertical direction and a distributed annular region 110.

FIG. 2A through FIG. 2E are top views of an integrated circuit formed according a first embodiment using a damascene metal process and an illumination source with a dipole component, depicted in successive stages of fabrication. The instant embodiment uses an illumination source with a dipole component, for example any of the illuminations sources described in reference to FIG. 1A through FIG. 1C. Referring to FIG. 2A, the integrated circuit 200 is formed in and on a semiconductor substrate 202, which may be, for example, a single crystal silicon wafer, a silicon wafer with silicon-germanium regions, a silicon-on-insulator (SOI) wafer, a hybrid orientation technology (HOT) wafer with regions of different crystal orientations, or other material appropriate for fabrication of the integrated circuit 200.

A dielectric layer 204 is formed over the substrate 202. The dielectric layer 204 may be a stack of dielectric sub-layers, and may include, for example a pre-metal dielectric (PMD) layer and an inter-level dielectric (ILD) layer. The PMD layer may include a PMD liner, a PMD main layer, and an optional PMD cap layer, not shown. The PMD liner may include silicon nitride or silicon dioxide, 10 to 100 nanometers thick, deposited by plasma enhanced chemical vapor deposition (PECVD) on an existing top surface of the integrated circuit 200. The PMD main layer may be a layer of silicon dioxide formed by a high aspect ration process (HARP) followed by a layer of silicon dioxide, phospho-silicate glass (PSG) or boro-phospho-silicate glass (BPSG), commonly 100 to 1000 nanometers thick, deposited by a PECVD process on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer.

The ILD layer may include, for example, an etch stop layer of 5 to 25 nanometers of silicon nitride, silicon carbide, or silicon carbide nitride, a main layer of 100 to 200 nanometers of low-k dielectric material such as organo-silicate glass (OSG), carbon-doped silicon oxides (SiCO or CDO) or dielectric material formed from methylsilsesquioxane (MSQ), or possibly ultra low-k dielectric material such as porous OSG (p-OSG), and a cap layer of 10 to 40 nanometers of silicon nitride, silicon carbide nitride or silicon carbide.

Areas for a plurality of parallel route tracks 206 are defined over the integrated circuit 200. A first interconnect pattern 208, depicted in FIG. 2A with a stipple pattern, is formed of photoresist over the dielectric layer 204 which creates a first plurality of exposed areas 210. The first interconnect pattern 208 is formed using an illumination source with a dipole component oriented perpendicular to the parallel route tracks 206. The first plurality of exposed areas 210 includes a first plurality of terminating lead patterns 212 which extend to, and terminate at, instances of a first point 216 in instances of the route tracks 206 and a first plurality of branching lead patterns 214 which extend to, and branch at, instances of the first point 216 in instances of the route tracks 206. In the instant embodiment, due to the dipole component of the illumination sources used in the photolithography process to produce the first interconnect pattern 208, a resolvable pitch distance of the first interconnect pattern 208 in a direction parallel to the parallel route tracks 206 is at least two times a pitch distance of the parallel route tracks 206. A first instance of the first plurality of exposed areas 210 in a first instance of the plurality of parallel route tracks 206 may be disposed immediately adjacent to a second instance of the first plurality of exposed areas 210 in a second instance of the plurality of parallel route tracks 206 immediately adjacent to the first instance of the plurality of parallel route tracks 206 as depicted in FIG. 2A. In one version of the instant embodiment, the illumination source may provide 193 nanometer radiation, and the pitch distance of the parallel route tracks 206 may be 75 to 81 nanometers. In one version of the instant embodiment, the first interconnect pattern 208 may be formed of novolak resin based photoresist and developed using a positive tone develop process such as exposure to an alkaline aqueous developing solution. In another version, the first interconnect pattern 208 may be formed of photoresist and developed using a negative tone develop process.

Figure 2B:
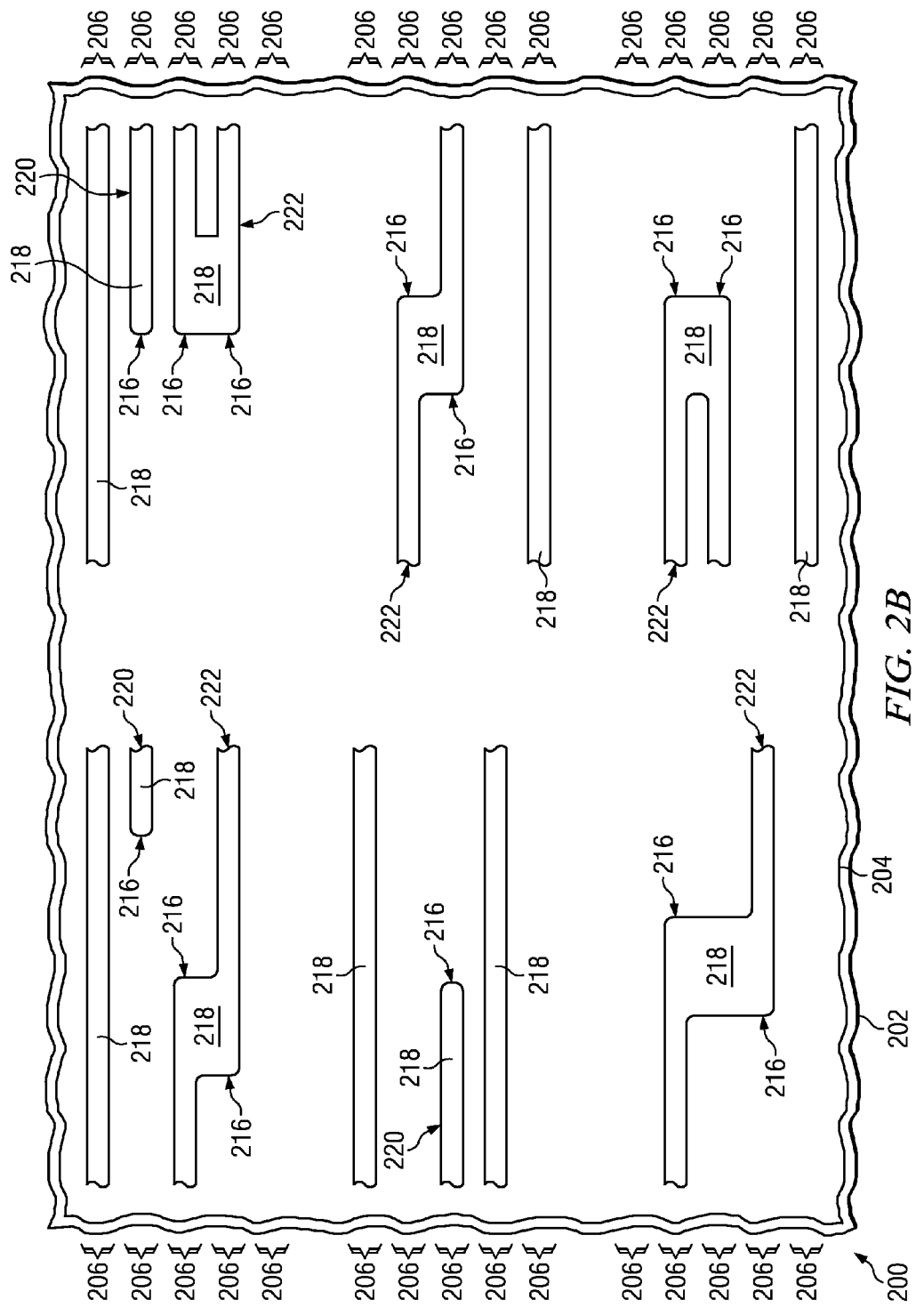

Referring to FIG. 2B, a first interconnect trench etch process is performed which removes dielectric material from the dielectric layer 204 in the first plurality of exposed areas 210 to form a first plurality of interconnect trenches 218, including a first plurality of terminating lead trenches 220 which extend to, and terminate at, instances of the first point 216 in instances of the parallel route tracks 206 and a first plurality of branching lead trenches 222 which extend to, and branch at, instances of the first point 216 in instances of the route tracks 206. The first interconnect pattern 208 is removed after the first interconnect trench etch process is completed, for example by exposing the integrated circuit 200 to an oxygen containing plasma, followed by a wet cleanup to remove any organic residue from the top surface of the dielectric layer 204.

Figure 2C:
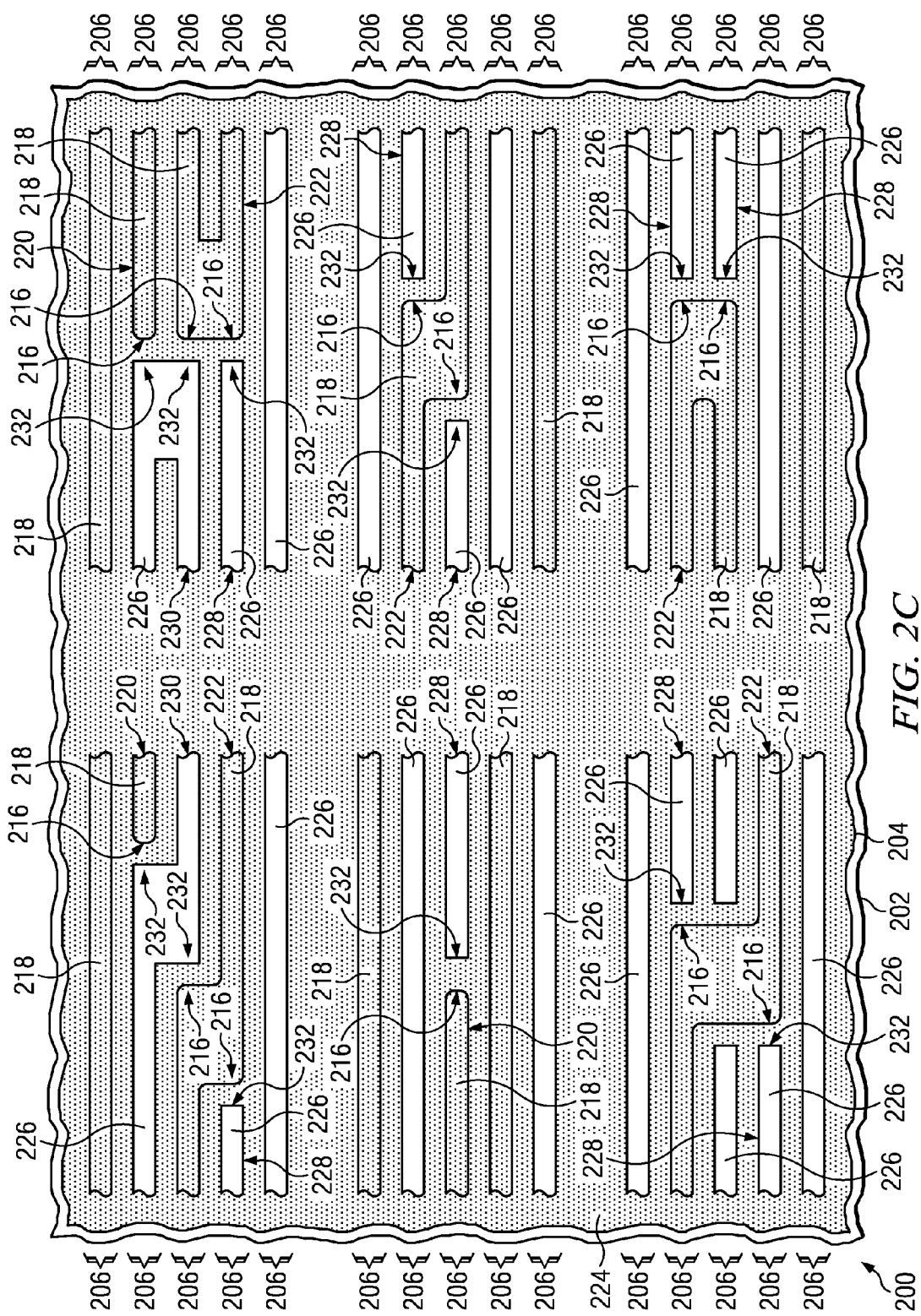

Referring to FIG. 2C, a second interconnect pattern 224, depicted in FIG. 2C with a stipple pattern, is formed of photoresist over the dielectric layer 204 which creates a second plurality of exposed areas 226. The second interconnect pattern 224 is formed with an illumination source having a substantially equal dipole component as the illumination source used to form the first interconnect pattern 208, and the dipole component is oriented perpendicular to the parallel route tracks 206. An instance of the second plurality of exposed areas 226 may be disposed immediately adjacent to an instance of the first plurality of interconnect trenches 218 as depicted in FIG. 2C. The second plurality of exposed areas 226 includes a second plurality of terminating lead patterns 228 which extend to, and terminate at, instances of a second point 232 proximate to corresponding instances of the first point 216 in instances of the route tracks 206 and a second plurality of branching lead patterns 230 which extend to, and branch at, instances of the second point 232 proximate to corresponding instances of the first point 216 in instances of the route tracks 206. Each instance of the second point 232 may be laterally separated from the corresponding instance of the first point 216 by a lateral distance of one to one and one-half times a space between adjacent parallel instances of the first plurality of exposed areas 210 and the second plurality of exposed areas 226 in the parallel route tracks 206.

Figure 2D:
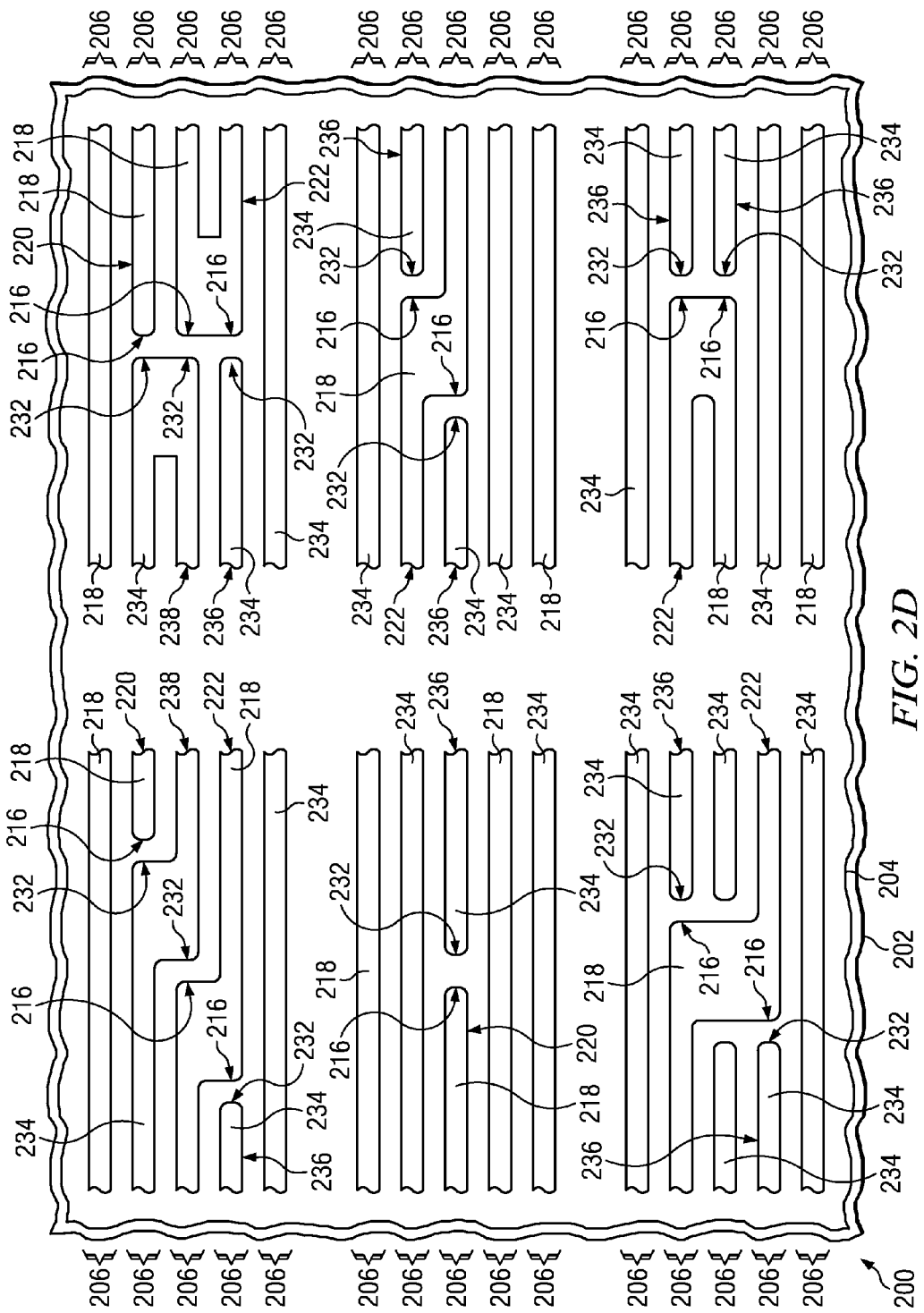

Referring to FIG. 2D, a second interconnect trench etch process is performed which removes dielectric material from the dielectric layer 204 in the second plurality of exposed areas 226 to form a second plurality of interconnect trenches 234, including a second plurality of terminating trenches 236 which extend to, and terminate at, instances of the second point 232 proximate to corresponding instances of the first point 216 in instances of the route tracks 206 and a second plurality of branching trenches 238 which extend to, and branch at, instances of the second point 232 proximate to corresponding instances of the first point 216 in instances of the route tracks 206. The second interconnect pattern 224 is removed after the second interconnect trench etch process is completed, for example as described in reference to FIG. 2B.

Figure 2E:
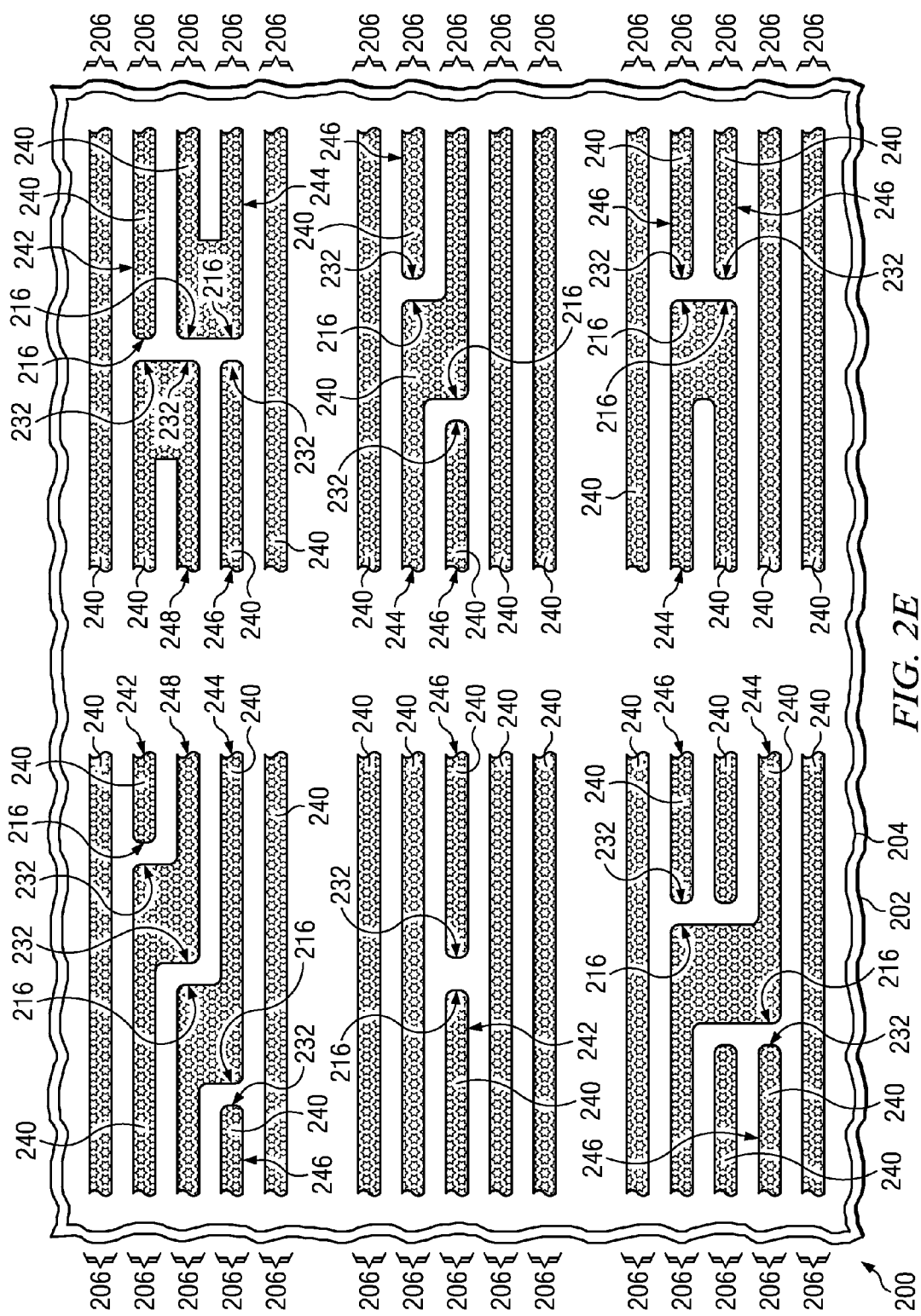

Referring to FIG. 2E, a damascene metal interconnect formation process is performed which forms metal interconnect lines 240 in the first plurality of interconnect trenches 218 and the second plurality of interconnect trenches 234. The metal interconnect lines 240 are depicted in FIG. 2E with a star hatch pattern. The damascene metal interconnect formation process may include, for example, forming a tantalum nitride liner 1 to 5 nanometers thick in the first plurality of interconnect trenches 218 and the second plurality of interconnect trenches 234 by an atomic layer deposition (ALD) process, forming a copper seed layer 5 to 80 nanometers thick on the liner by sputtering, electroplating copper on the seed layer so as to fill the first plurality of interconnect trenches 218 and the second plurality of interconnect trenches 234, and subsequently removing copper and liner metal from a top surface of the dielectric layer 204 by a copper CMP process.

The metal interconnect lines 240 include a first plurality of terminating lines 242, formed in the first plurality of terminating lead trenches 220, which extend to, and terminate at, instances of the first point 216 in instances of the route tracks 206, and a first plurality of branching lines 244, formed in the first plurality of branching lead trenches 222, which extend to, and branch at, instances of the first point 216 in instances of the route tracks 206. The metal interconnect lines 240 further include a second plurality of terminating lines 246, formed in the second plurality of terminating trenches 236, which extend to, and terminate at, instances of the second point 232 proximate to corresponding instances of the first point 216 in instances of the route tracks 206, and a second plurality of branching lines 248, formed in the second plurality of branching trenches 238, which extend to, and branch at, instances of the second point 232 proximate to corresponding instances of the first point 216 in instances of the route tracks 206. Instances of the second plurality of terminating lines 246 may be laterally separated at corresponding instances of the second point 232 from laterally adjacent instances of the first plurality of terminating lines 242 at corresponding instances of the first point 216 by a lateral distance of one to one and one-half times a space between adjacent parallel instances of the metal interconnect lines 240 in the parallel route tracks 206.

Figure 3A:
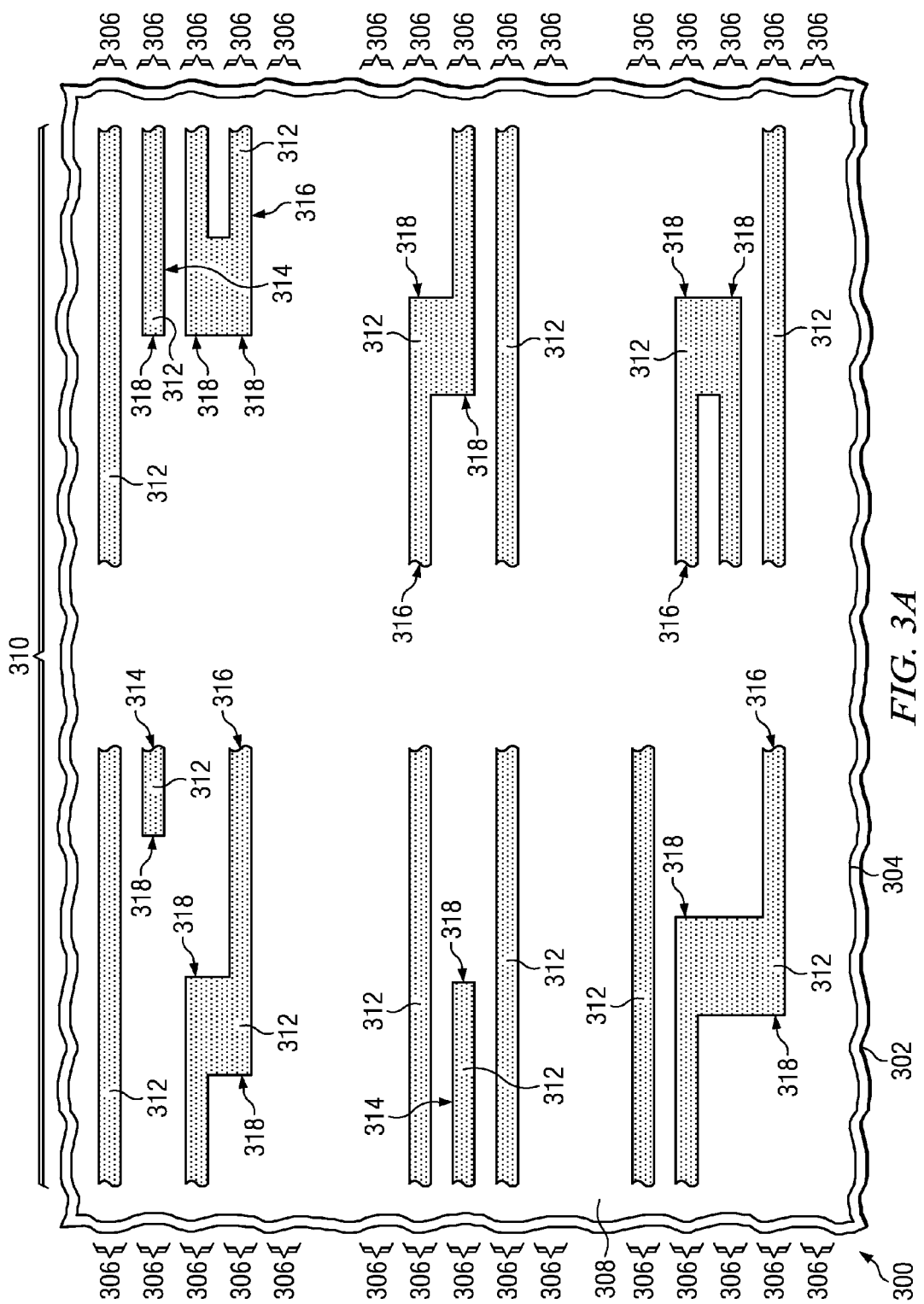
FIG. 3A through FIG. 3D are top views of an integrated circuit formed according a first embodiment using an etched metal process and an illumination source with a dipole component, depicted in successive stages of fabrication.

FIG. 3A through FIG. 3D are top views of an integrated circuit formed according a first embodiment using an etched metal process and an illumination source with a dipole component, depicted in successive stages of fabrication. The instant embodiment uses an illumination source with a dipole component, for example any of the illuminations sources described in reference to FIG. 1A through FIG. 1C. Referring to FIG. 3A, the integrated circuit 300 is formed in and on a semiconductor substrate 302 as described in reference to FIG. 2A. A dielectric layer 304 is formed over the substrate 302, as described in reference to FIG. 2A. Areas for a plurality of parallel route tracks 306 are defined over the integrated circuit 300. An interconnect metal layer 308 is formed over the dielectric layer 304. The interconnect metal layer 308 may include, for example, an adhesion layer of titanium tungsten or titanium nitride 3 to 15 nanometers thick formed by a metal organic chemical vapor deposition (MOCVD) process, a sputtered aluminum layer with 0.5 to 2 percent copper, silicon and/or titanium 100 to 200 nanometers thick, and a titanium nitride cap layer 5 to 20 nanometers thick formed by an MOCVD process.

A first interconnect pattern 310, depicted in FIG. 3A with a stipple pattern, is formed of photoresist over the interconnect metal layer 308 which creates a first plurality of masked areas 312. The first interconnect pattern 310 is formed using an illumination source with a dipole component oriented perpendicular to the parallel route tracks 306. The first plurality of masked areas 312 includes a first plurality of terminating lead patterns 314 which extend to, and terminate at, instances of a first point 318 in instances of the route tracks 306 and a first plurality of branching lead patterns 316 which extend to, and branch at, instances of the first point 318 in instances of the route tracks 306. In the instant embodiment, due to the dipole component of the illumination sources used in the photolithography process to produce the first interconnect pattern 310, a resolvable pitch distance of the first interconnect pattern 310 in a direction parallel to the parallel route tracks 306 is at least two times a pitch distance of the parallel route tracks 306. A first instance of the first plurality of masked areas 312 in a first instance of the plurality of parallel route tracks 306 may be disposed immediately adjacent to a second instance of the first plurality of masked areas 312 in a second instance of the plurality of parallel route tracks 306 immediately adjacent to the first instance of the plurality of parallel route tracks 306 as depicted in FIG. 3A. In one version of the instant embodiment, the illumination source may provide 193 nanometer radiation, and the pitch distance of the parallel route tracks 306 may be 75 to 81 nanometers. The first interconnect pattern 310 may be formed using a positive tone develop process or a negative tone develop process, as described in reference to FIG. 2A.

Figure 3B:
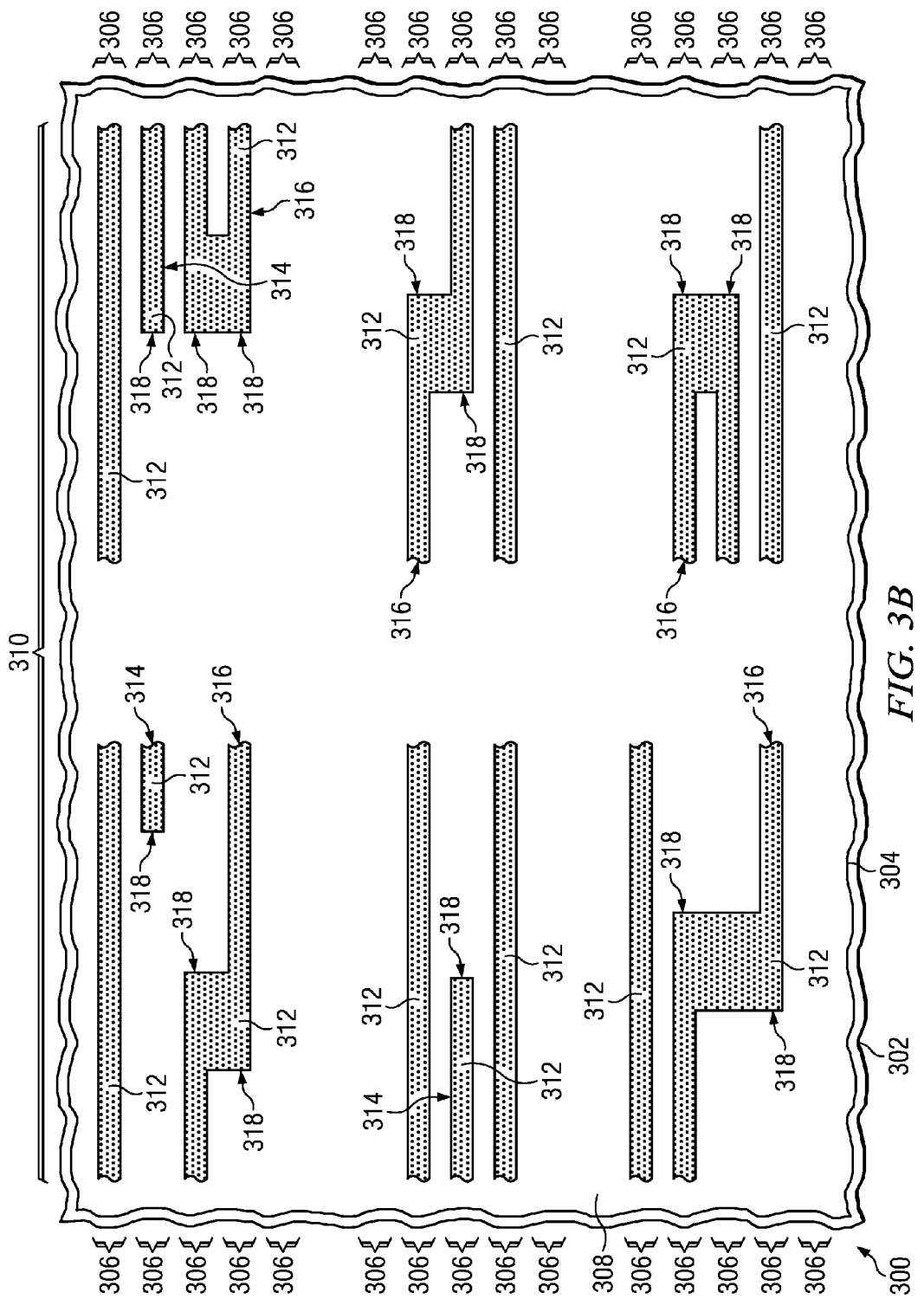

Referring to FIG. 3B, a resist freeze process is performed which hardens the first interconnect pattern 310 so as to allow a second photoresist pattern to be formed on the integrated circuit 300. The first interconnect pattern 310 after completion of the resist freeze process is depicted in FIG. 3B with a coarse stipple pattern. The litho freeze process may include, for example, an ultraviolet (UV) cure step, a thermal cure step and/or a chemical cure step.

Figure 3C:
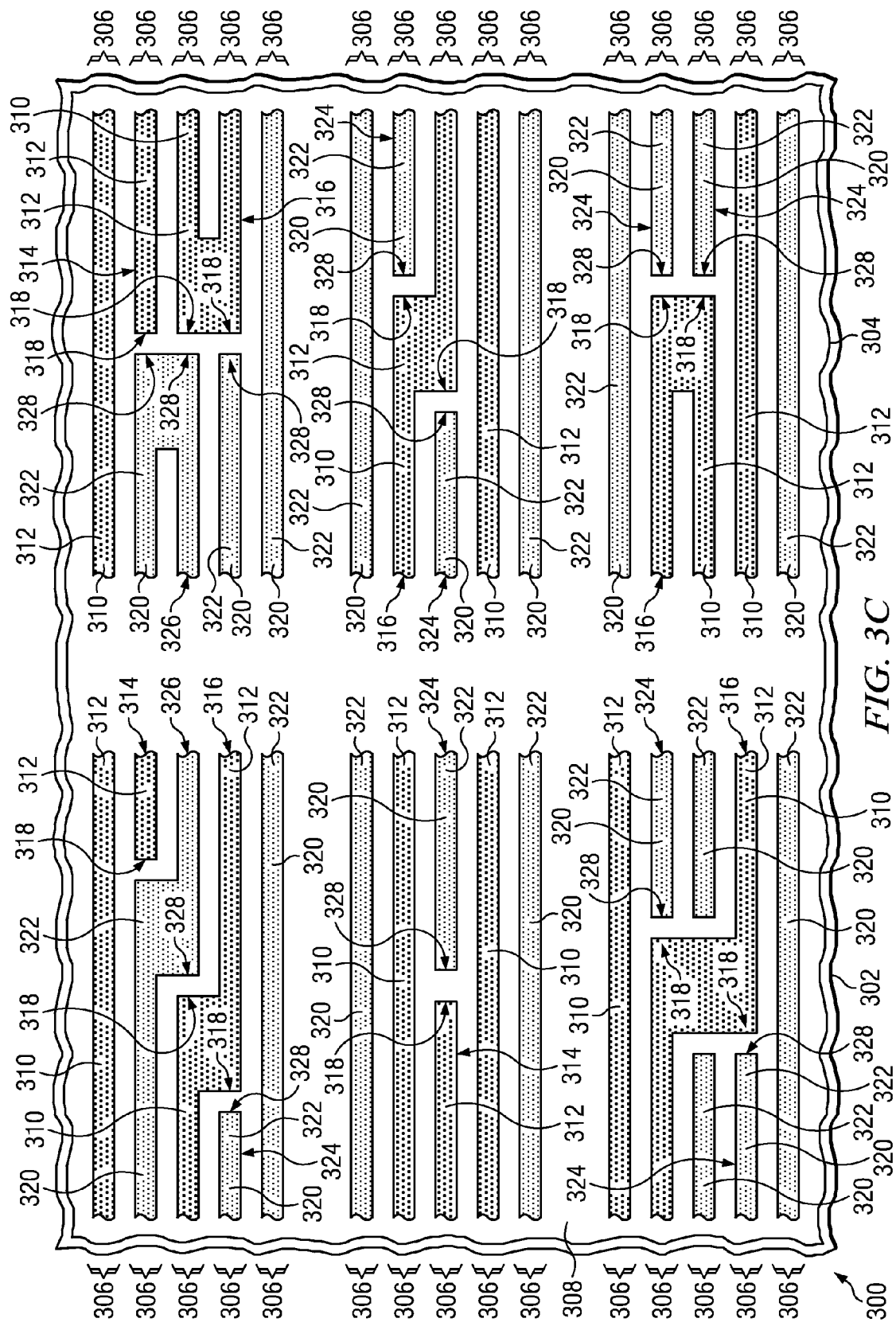

Referring to FIG. 3C, a second interconnect pattern 320, depicted in FIG. 3C with a stipple pattern, is formed of photoresist over the interconnect metal layer 308 which creates a second plurality of masked areas 322. The second interconnect pattern 320 is formed with an illumination source having a substantially equal dipole component as the illumination source used to form the first interconnect pattern 310, and the dipole component is oriented perpendicular to the parallel route tracks 306. A first instance of the second plurality of masked areas 322 in a first instance of the plurality of parallel route tracks 306 may be disposed immediately adjacent to a second instance of the second plurality of masked areas 322 in a second instance of the plurality of parallel route tracks 306 immediately adjacent to the first instance of the plurality of parallel route tracks 306 as depicted in FIG. 3C. The second plurality of masked areas 322 includes a second plurality of terminating lead patterns 324 which extend to, and terminate at, instances of a second point 328 proximate to corresponding instances of the first point 318 in instances of the route tracks 306 and a second plurality of branching lead patterns 326 which extend to, and branch at, instances of the second point 328 proximate to corresponding instances of the first point 318 in instances of the route tracks 306. Each instance of the second point 328 is laterally separated from the corresponding instance of the first point 318 by a lateral distance of one to one and one-half times a space between adjacent parallel instances of the first plurality of masked areas 312 and the second plurality of masked areas 322 in the parallel route tracks 306.

Figure 3D:
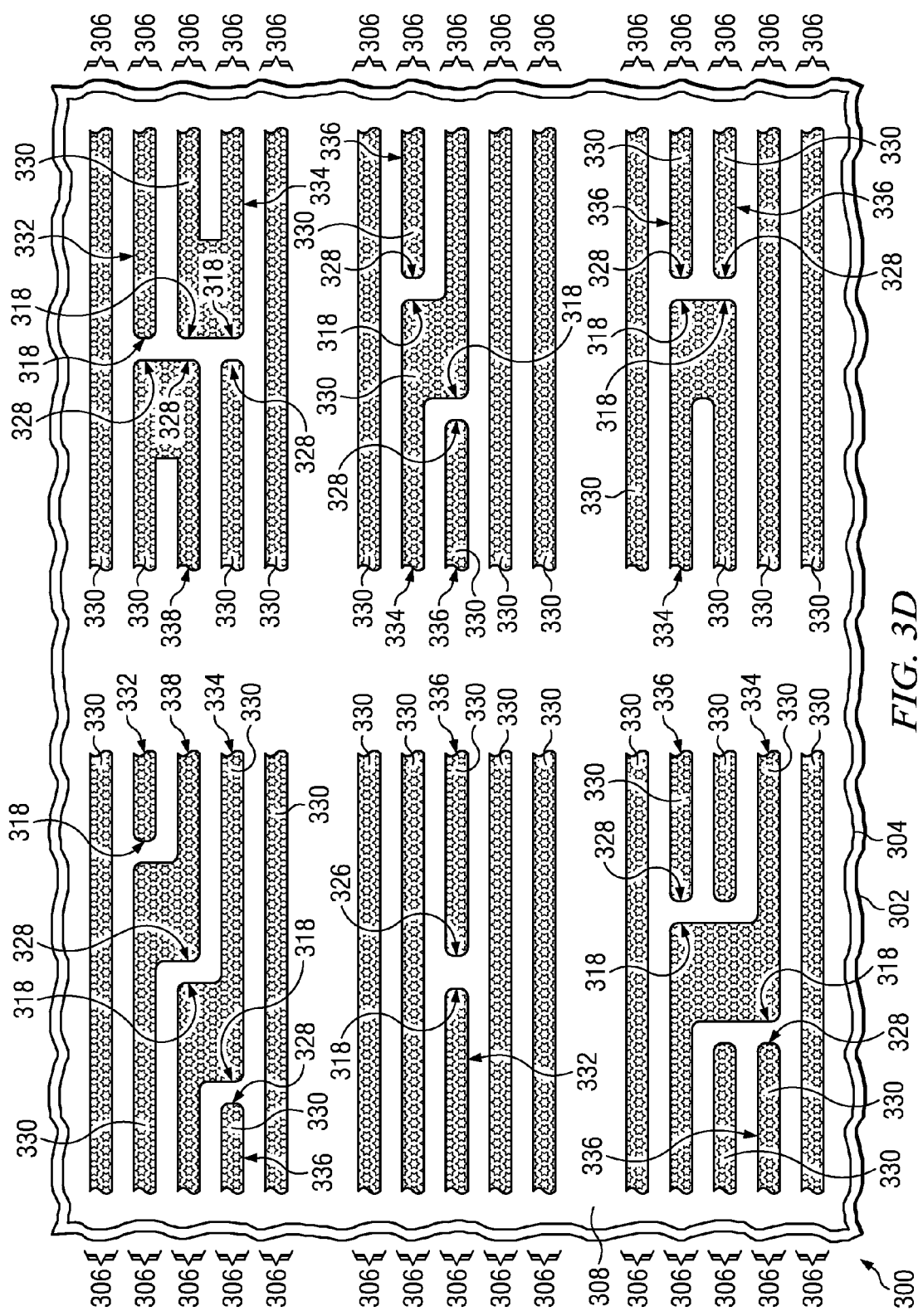

Referring to FIG. 3D, a metal etch process is performed which removes metal from the interconnect metal layer 308 outside of the first interconnect pattern 310 and the second interconnect pattern 320 so as to form metal interconnect lines 330, depicted in FIG. 3D with a star hatch pattern. The metal etch process may include, for example an RIE step with a chlorine-containing plasma to etch the aluminum. The metal interconnect lines 330 are disposed in an interconnect level of the integrated circuit 300 defined by the first interconnect pattern 310 and the second interconnect pattern 320.

The metal interconnect lines 330 include a first plurality of terminating lines 332, formed in areas defined by the first plurality of terminating lead patterns 314, which extend to, and terminate at, instances of the first point 318 in instances of the route tracks 306, and a first plurality of branching lines 334, formed in the first plurality of branching lead patterns 316, which extend to, and branch at, instances of the first point 318 in instances of the route tracks 306. The metal interconnect lines 330 further include a second plurality of terminating lines 336, formed in areas defined by the second plurality of terminating lead patterns 324, which extend to, and terminate at, instances of the second point 328 proximate to corresponding instances of the first point 318 in instances of the route tracks 306, and a second plurality of branching lines 338, formed in areas defined by the second plurality of branching lead patterns 326, which extend to, and branch at, instances of the second point 328 proximate to corresponding instances of the first point 318 in instances of the route tracks 306. Instances of the second plurality of terminating lines 336 may be laterally separated at corresponding instances of the second point 328 from laterally adjacent instances of the first plurality of terminating lines 332 at corresponding instances of the first point 318 by a lateral distance of one to one and one-half times a space between adjacent parallel instances of the metal interconnect lines 330 in the parallel route tracks 306.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps of:
    forming a dielectric layer over a substrate;
    defining areas for a plurality of parallel route tracks on a top surface of said dielectric layer, said plurality of parallel route tracks having a pitch distance;
    forming a first interconnect pattern creating a plurality of first exposed areas including a first lead pattern, wherein said first lead pattern is located in an instance of said plurality of parallel route tracks;
    performing a first trench etch process to form a plurality of first interconnect trenches in said plurality of first exposed areas;
    forming a second interconnect pattern creating a plurality of second exposed areas including a second lead pattern, wherein said second lead pattern is located in said instance of said plurality of parallel route tracks, wherein said second lead pattern is separated from said first lead pattern by a distance of one to one and one-half times a space between said first lead pattern and an adjacent lead pattern located in an adjacent instance of said plurality of parallel route tracks;
    wherein said first interconnect pattern and said second interconnect pattern are formed using two distinct photolithography processes having a dipole illumination source;
    performing a second trench etch process to form a plurality of second interconnect trenches in said plurality of second exposed areas; and
    forming metal interconnect lines in said first interconnect trenches and said second interconnect trenches.

2. The process of claim 1, in which said first lead pattern terminates adjacent to said second lead pattern.

3. The process of claim 1, in which said first lead pattern branches adjacent to said second lead pattern.

4. The process of claim 1, in which:
    said dipole illumination source provides 193 nanometer radiation; and
    said pitch distance of said plurality of parallel route tracks is 75 to 81 nanometers.

5. A process of forming an integrated circuit, comprising the steps of:
    forming a dielectric layer over a substrate;
    defining a plurality of parallel route tracks on a top surface of said dielectric layer, said plurality of parallel route tracks having a pitch distance;
    forming a first interconnect pattern in said plurality of parallel route tracks including a first lead pattern located in a route track of said plurality of parallel route tracks;
    forming a second interconnect pattern in said plurality of parallel route tracks including a second lead pattern located in said route track, wherein said second lead pattern is separated from said first lead pattern in said route track by a distance of one to one and one-half times a space between interconnect patterns in adjacent instances of said plurality of parallel route tracks;
    wherein said first interconnect pattern and said second interconnect pattern are formed using two distinct photolithography processes which have dipole illumination sources capable of resolving said interconnect patterns in adjacent instances of said plurality of parallel route tracks; and
    forming metal interconnect lines in said dielectric layer as defined by said first interconnect pattern and said second interconnect pattern.

6. The process of claim 5, in which:
said dipole illumination source provides 193 nanometer radiation; and
said pitch distance of said parallel route tracks is 75 to 81 nanometers.

7. A process of forming an integrated circuit, comprising the steps of:
forming a dielectric layer over a substrate;
defining areas for a plurality of parallel route tracks on a top surface of said dielectric layer, said plurality of parallel route tracks having a pitch distance;
forming a first interconnect pattern over said dielectric layer, said first interconnect pattern creating a first plurality of lead patterns which extend to instances of a first point in instances of said parallel route tracks;
performing a first trench etch process to form a first plurality of interconnect trenches using said first interconnect pattern;
forming a second interconnect pattern over said dielectric layer, said second interconnect pattern creating a second plurality of lead patterns which extend to instances of a second point in said instances of said parallel route tracks, in which each instance of said second point is laterally separated from a corresponding instance of said first point by a distance of one to one and on-half times a space between adjacent parallel instances of said first plurality of exposed areas and the second plurality of exposed areas in said parallel route tracks;
wherein said first interconnect pattern and said second interconnect pattern are formed using two distinct photolithography processes having a dipole illumination source;
performing a second trench etch process to form a second plurality of interconnect trenches using said second interconnect pattern; and
forming metal interconnect lines in said first plurality of interconnect trenches and said second plurality of interconnect trenches, said metal interconnect lines including:
a first plurality of lines, which extend to instances of said first point in instances of said parallel route tracks; and
a second plurality of lines, which extend to instances of said second point proximate to corresponding instances of said first point in instances of said route tracks.

8. The process of claim 1, in which a subset of said first plurality of lines terminate at said instances of said first point.

9. The process of claim 1, in which a subset of said first plurality of lines branch at said instances of said first point.

10. The process of claim 1, in which:
said dipole illumination source provides 193 nanometer radiation; and
said pitch distance of plurality of said parallel route tracks is 75 to 81 nanometers.

* * * * *